(12) United States Patent
Ueda

(10) Patent No.: US 6,873,559 B2
(45) Date of Patent: Mar. 29, 2005

(54) METHOD AND APPARATUS FOR ENHANCED SENSING OF LOW VOLTAGE MEMORY

(75) Inventor: Hirokazu Ueda, Nishiwaki (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/345,008

(22) Filed: Jan. 13, 2003

(65) Prior Publication Data

US 2004/0136252 A1 Jul. 15, 2004

(51) Int. Cl.$^7$ ................................................ G11C 7/00
(52) U.S. Cl. ................... 365/205; 365/207; 365/189.11
(58) Field of Search ............................... 365/205, 207, 365/208, 189.11, 227

(56) References Cited

U.S. PATENT DOCUMENTS

| | | | |
|---|---|---|---|
| 4,669,063 A | | 5/1987 | Kirsch |
| 4,692,642 A | | 9/1987 | Fukuzo et al. |
| 4,694,205 A | | 9/1987 | Shu et al. |
| 4,855,628 A | | 8/1989 | Jun |
| 5,042,011 A | | 8/1991 | Casper et al. |
| 5,245,578 A | | 9/1993 | McLaury |
| 5,438,543 A | | 8/1995 | Yoon |
| 5,544,110 A | * | 8/1996 | Yuh ........................... 365/205 |
| 5,614,856 A | | 3/1997 | Wilson et al. |
| 5,638,333 A | | 6/1997 | Lee |
| 5,646,899 A | | 7/1997 | Jang et al. |
| 6,157,586 A | | 12/2000 | Ooishi |
| 6,320,798 B1 | | 11/2001 | Jo et al. |
| 6,477,100 B2 | | 11/2002 | Takemura et al. |
| 6,522,593 B2 | * | 2/2003 | Kim et al. .................. 365/205 |

OTHER PUBLICATIONS

Nobutaro Shibata, "Current Sense Amplifiers for Low–Voltage Memories", IEICE Trans. Electron., Aug. 1997, pp. 1120–1130, vol. E79–C, No. 8.

* cited by examiner

Primary Examiner—Gene N. Auduong
(74) Attorney, Agent, or Firm—TraskBritt

(57) ABSTRACT

A differential sensing circuit and sensing method for use in a low voltage memory device. The sensing circuit includes a cross-coupled sensing circuit for coupling with a memory element, a pull-up circuit and a multistage pull-down circuit. The multistage pull-down circuit accelerates the latching process of the cross-coupled sensing circuit by briefly pulling the cross-coupled sensing circuit to a potential below ground in order to increase the gate potential differential on at least a portion of the transistors within the cross-coupled sensing circuit. Once the latching transitions have commenced at an acceptable rate, the below-ground potential is removed and the traditional logic level pull-up and ground-potential pull-down circuits are activated.

38 Claims, 8 Drawing Sheets

METHOD AND APPARATUS FOR ENHANCED SENSING OF LOW VOLTAGE MEMORY

BACKGROUND OF THE INVENTION

1. Field of the Invention

The present invention relates generally to semiconductor integrated circuits and, in particular, to a sense amplifier device used in integrated circuit memories.

2. State of the Art

With the advent of electronic devices such as laptop and hand-held computers as well as other electronic devices that utilize memory components, the need has increased for circuitry that operates efficiently at lower power supply voltages. Additionally, in order to increase performance speeds in memory components, the physical dimensions of the operational circuits have also been decreased which, in turn, requires lower voltages. Older memories and the sense amplifiers used to read stored information from those memories were developed for use with 5.0 volt and 3.0 volt supply voltages and have generally proven inadequate for use with lower voltage memory devices.

In conventional sense amplifier designs, such as in the case of a DRAM sense amplifier, a so-called "precharging" of the sense amplifier occurs prior to a read operation of the stored memory information. As the voltage levels to such memory devices are reduced, the precharge potential, which is generally one-half the power supply potential, is also reduced. In the case of an MOS memory configuration, when the absolute value of the threshold voltage of a MOS transistor of a sense amplifier is increased, generally due to a "body affect," and the precharge potential is reduced due to a lowered operating voltage, the difference between the precharge potential and the threshold voltage becomes smaller. Such a small potential difference results in a reduction in the sensing speed and may even result in the failure of a conventional sense amplifier to transition into a sensed state when presented with the data potential in the memory element. Therefore, a need exists for providing an improved circuit for improving the sense operation speed of a sense amplifier in a reduced or low voltage memory device configuration.

BRIEF SUMMARY OF THE INVENTION

The present invention recognizes the latency and even the inability of prior sense circuit configurations to transition into a latched configuration when applied to low voltage semiconductor memory devices. Accordingly, the present invention includes a differential sensing circuit having a pair of data line inputs (e.g., bit lines) that couple at least indirectly to the memory element. The data line pair further couples to a cross-coupled sensing circuit, configured in one embodiment as cross-coupled CMOS inverters. The cross-coupled sensing circuit provides latching to a specific state in the presence of a differential input signal as supplied by the data line pair. In order to amplify the sensed signal to full logic voltage levels, the sensing circuit further includes a pull-up circuit and a pull-down circuit oppositely coupled to the cross-coupled sensing circuit.

In order to enhance the latching process of the cross-coupled sensing circuit, the pull-down circuit is implemented as an at least two-stage pull-down circuit. The first stage of the pull-down circuit is initially activated prior to the assertion of the pull-up circuit. In the first stage of the pull-down circuit, the cross-coupled sensing circuit is briefly pulled down to a voltage potential below the ground reference, which increases the driving abilities of the transistors within the cross-coupled sensing circuit. Increased drive potentials cause the transistors to cascade into their latched state at an improved rate. In order to prevent any deleterious effects resulting from operating logic level circuitry outside the data logic level potentials, the below-ground potential is coupled to the cross-coupled sensing circuit for only a brief time interval.

Following the activation of the first stage of the pull-down circuit, the pull-up circuit pulling the cross-coupled sensing circuit to a pull-up potential and at least one other stage of the pull-down circuit, which pulls the cross-coupled sensing circuit to a ground potential, may be activated, either in a simultaneous manner or in an overlapped but staggered manner. Various embodiments for timing the activation of the respective activation signals is presented with circuitry for preventing the simultaneous activation of other pulling signals with the below-ground pull-down activation.

Various other embodiments are also presented including a sense amplifier comprising the sensing circuit and precharge circuitry for precharging the data line pair to a precharge potential prior to the memory element state sensing process. Further embodiments include a memory device comprising the sensing circuitry as well as memory elements and their associated buffering and decoding.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
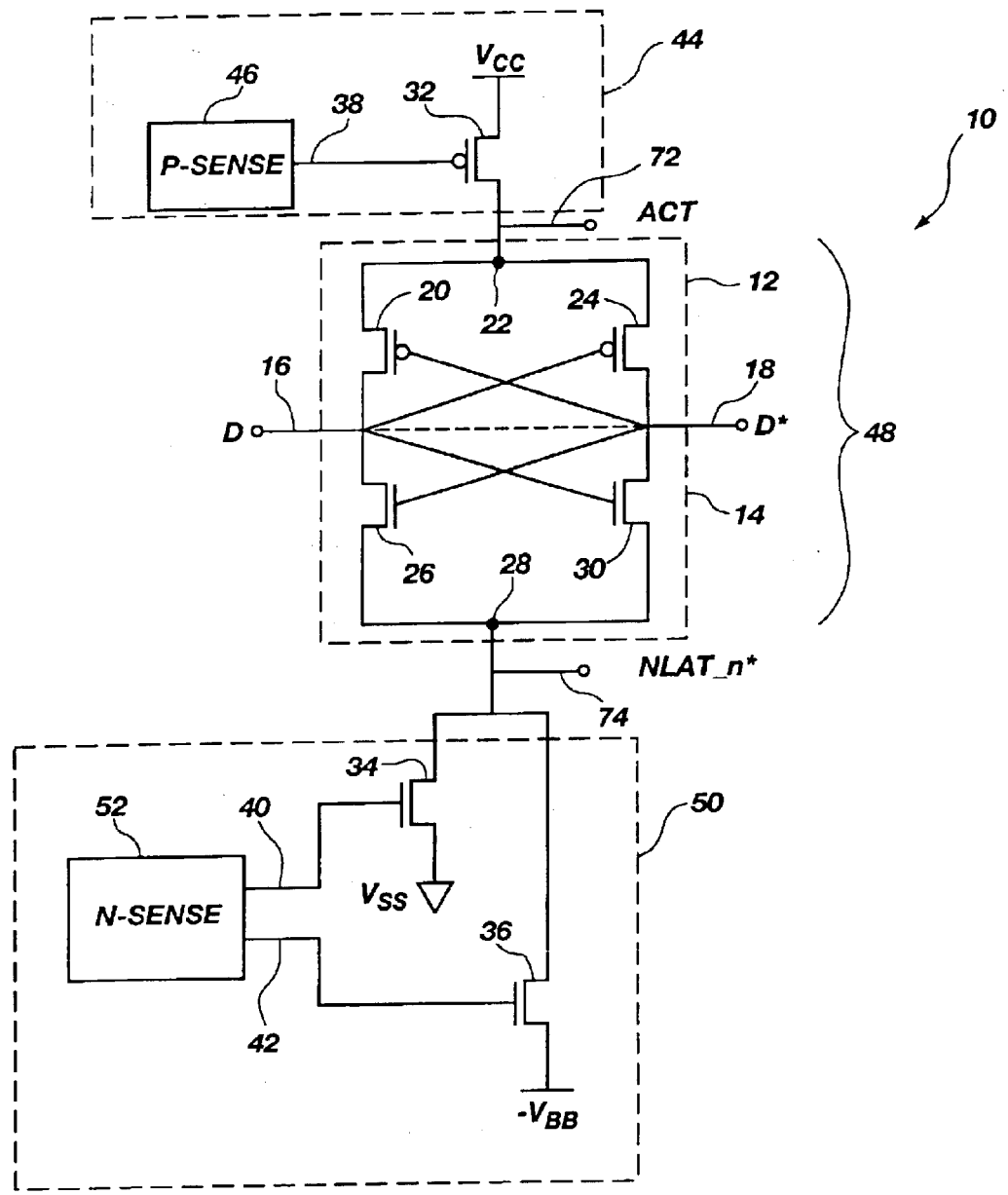
FIG. 1 is a circuit schematic of a sensing circuit, in accordance with an embodiment of the present invention.

FIG. 1 is a diagram illustrating a data line sensing circuit 10 in accordance with an embodiment of the present invention. Sensing circuit 10 includes a PMOS sensing circuit 12 and an NMOS sensing circuit 14 respectively connected between bit or data lines D 16 and D* 18. The PMOS sensing circuit 12 includes a first PMOS transistor 20 including a source electrode connected to a sensing node 22, a drain electrode connected to the data line D 16 and a gate electrode connected to the data line D* 18, and a second PMOS transistor 24 including a source electrode connected to the sensing node 22, a drain electrode connected to the data line D* 18 and a gate electrode connected to the data line D 16.

The NMOS sensing circuit 14 includes a first NMOS transistor 26 with a drain electrode connected to a sensing node 28, a source electrode connected to the data line D 16 and a gate electrode connected to the data line D* 18, and a second NMOS transistor 30 with a drain electrode connected to the sensing node 28, a source electrode connected to the data line D* 18 and a gate electrode connected to the data line D 16.

A third PMOS transistor 32 for supplying a power voltage VCC is connected to the sensing node 22. A third NMOS transistor 34 for supplying a ground voltage VSS is connected to the sensing node 28. A fourth NMOS transistor 36 for supplying a negative bias voltage—VBB is connected to the sensing node 28. P-sense control signal 38 is connected to the gate electrode of third PMOS transistor 32 and N-sense ground control signal 40 is connected to the gate electrode of the third NMOS transistor 34 while the N-sense below-ground control signal 42 is connected to the gate electrode of NMOS transistor 36. If the third PMOS transistor 32 and either the fourth NMOS transistor 36 or the NMOS transistor 34 are turned on, the power voltage VCC and either the below-ground voltage—VBB or the ground voltage VSS are supplied to the sensing nodes 22 and 28, respectively, thereby operating the PMOS sensing circuit 12 and the NMOS sensing circuit 14.

In the present embodiment of the present invention, sensing circuit pull-up circuit 44, including the pull-up PMOS transistor 32 and pull-up circuit control logic 46, cooperatively function as the pull-up circuit to a cross-coupled sensing circuit 48. Similarly, NMOS transistors 34 and 36 cooperatively function as a multistage pull-down circuit 50 as well as multistage pull-down circuit control logic 52.

Figure 2:
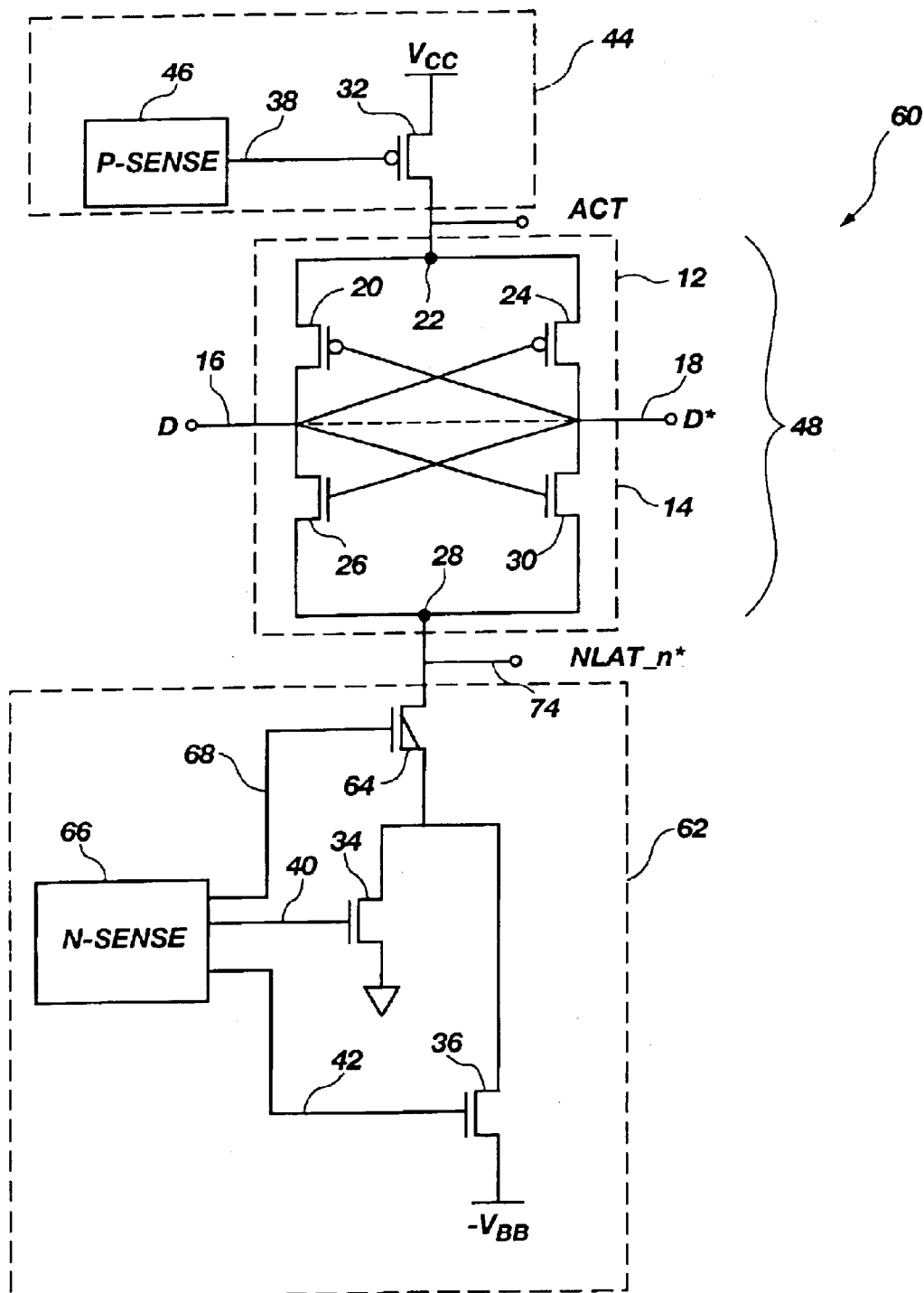
FIG. 2 is a circuit schematic of a sensing circuit, in accordance with another embodiment of the present invention.

FIG. 2 illustrates a data line sensing circuit in accordance with another embodiment of the presenting invention. In the present embodiment, a data line sensing circuit 60 includes the cross-coupled sensing circuit 48 for sensing the state of data lines D 16 and D* 18. To aid in the sensing process, the data line sensing circuit 60 further includes the pull-up circuit 44 which includes the PMOS transistor 32 controlled by the P-sense control signal 38 as generated by pull-up circuit control logic 46. Additionally, data line sensing circuit 60 further includes a multistage pull-down circuit 62 for providing a lower potential or voltage reference for pulling the sensing node 28 toward the provided lower voltage. In the present embodiment, the multistage pull-down circuit 62 includes a low Vt NMOS transistor 64 for reducing current leakage in the multistage pull-down circuit of the present embodiment. Furthermore, the multistage pull-down circuit 62 further includes the NMOS transistors 34 and 36 as well as a multistage pull-down circuit control logic 66 for generating N-sense latch control signal 68, N-sense ground control signal 40 and N-sense below-ground control signal 42. While a multistage pull-down circuit has been illustrated as including only two stages within the pull-down circuit, the present invention contemplates applications where waveforming of the pull-down potential profile would be desirable and, therefore, multiple stages beyond two pull-down transistors is contemplated within the scope of the present invention.

Figure 3:
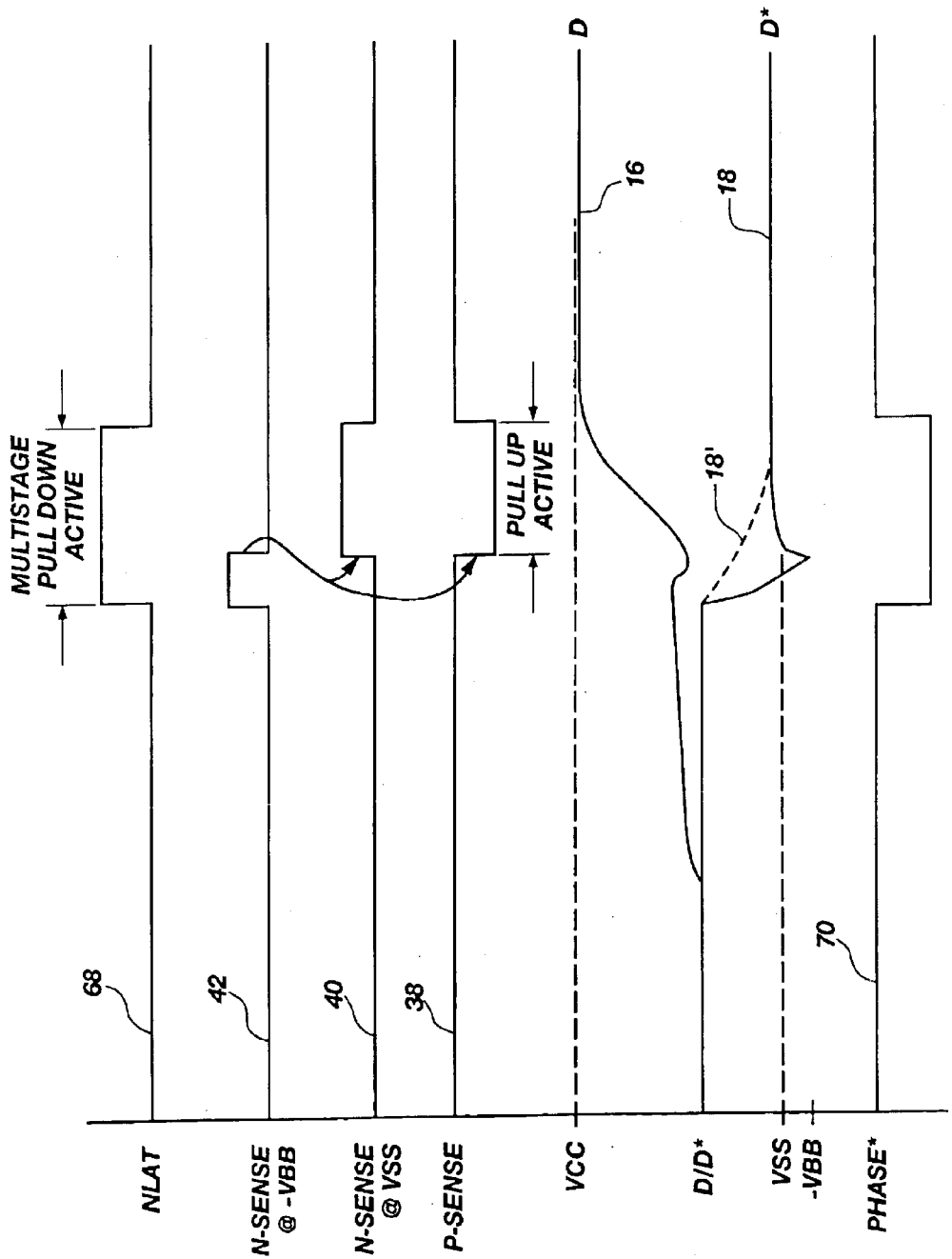
FIG. 3 is a waveform diagram of the sensing circuit, in accordance with the present invention.

FIG. 3 is a waveform diagram illustrating the related signaling, in accordance with an embodiment of the present invention. In accordance with conventional memory device bit sensing, in an initial state, the data lines D 16, D* 18 (FIGS. 1 and 2) are precharged to an intermediate voltage of approximately ½ the level of VCC. The data lines are generally pass-gate coupled to the cross-coupled sensing circuit 48 (FIGS. 1 and 2) with present data signals illustrated on data line D 16 and data line D* 18. Prior to the activation of either the pull-up circuit 44 or the multistage pull-down circuit, a small differential signal is present on the respective data lines D 16, D* 18 as illustrated in FIG. 3. Once a sense enablement phase* control signal 70 becomes active low, the multistage pull-down circuit becomes activated. In the embodiment of FIG. 2, an N-sense latch control signal 68 is activated by the multistage pull-down control logic 66 (FIG. 2), which provides current leakage protection to the cross-coupled sensing circuit 48 (FIG. 2). Subsequently, the N-sense below-ground control signal 42 activates NMOS transistor 36 (FIGS. 1 and 2) and pulls the cross-coupled sensing circuit 48 toward a voltage that is less than ground potential, thereby increasing the VGS across the transistors of the cross-coupled sensing circuit 48 to an amount greater than the Vt of the transistors. By increasing the VGS across these transistors, the cross-coupled sensing circuit 48 is able to latch at a much faster rate. Alternatively, it is also desirable to "precharge" the source electrode of transistor 64 by activating the N-sense below-ground control signal just prior to the activation of transistor 64.

As illustrated in FIG. 3, once the N-sense below-ground control signal 42 becomes active, the data lines D 16 and D* 18 diverge at a much greater rate than occurs without utilization of a below-ground voltage, illustrated as the dashed waveform 18'. In order to prevent overly negative charging of the cross-coupled sensing circuit 48 and presenting deleterious conditions in a subsequent sense operation, once the separation has been accelerated, the cross-coupled sensing circuit 48 is coupled to a ground reference through activation of the N-sense ground control signal 40.

Figure 4:
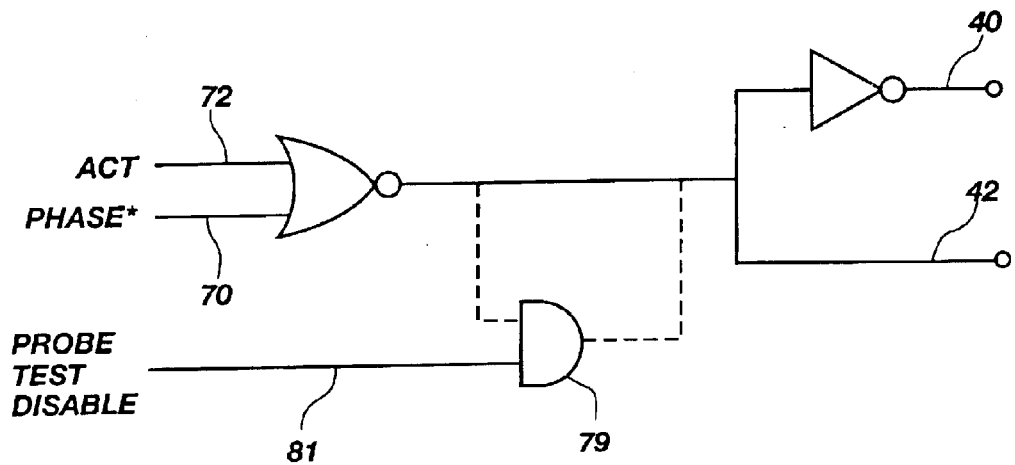
FIG. 4 is circuit diagram for controlling the activation of the pull-down circuit, in accordance with an embodiment of the present invention.
Figure 5:
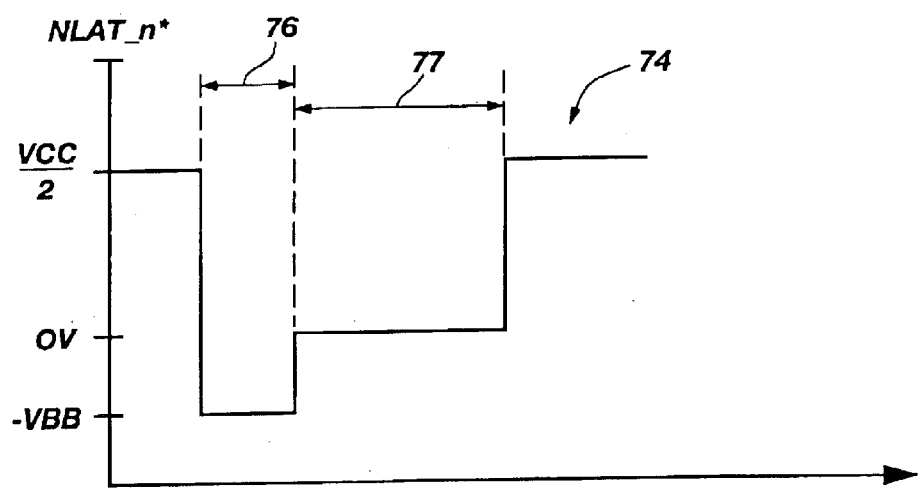
FIG. 5 is a waveform diagram illustrating the pull-down potential presented to the cross-coupled sensing circuit, in accordance with the pull-down control circuit of FIG. 4.

Two separate control circuits are presented in FIGS. 4 and 6 for preventing the simultaneous activation of both the N-sense below-ground control signal 42 and the P-sense control signal 38 which would result in an undesirable reference voltage shift. FIG. 4 illustrates a circuit having input signals of the sense enablement phase* control signal 70 and a P-sense activation status signal 72 which are combined through logic gates to prevent a simultaneous activation. FIG. 5 illustrates the multistage pull-down waveform as generated by the circuit of FIG. 4 and as observed at an N-sense activation status signal 74. A time period 76 identifies the duration for activation of the N-sense below-ground control signal 42 and a time period 77 identifies a duration wherein both the N-sense ground control signal 40 and the P-sense control signal 38 may be activated. It should be appreciated that this duration is a function of the relative speeds and threshold voltages of the transistors of the cross-coupled sensing circuit 48. It is desirable that the duration be adjusted to facilitate a more rapid separation of the differential signals while not retaining a negative potential for an extended duration after the pull-up circuit 44 becomes active. Methods and circuits for implementing duty cycle adjustments to timing circuits are appreciated by those of ordinary skill in the art.

FIG. 4 further illustrates a logic gate 79 for coupling within the multistage pull-down circuit control logic 66 for eliminating the multistage ability of the multistage pull-down circuit 62 during testing, including probe testing. When probe test disable signal 81 is asserted, the sensing circuit 60 functions as a single stage pull-down sensing circuit. Such a sensing mode is desirable for lower-speed testing and segregation. Disable signal 81 may also be used to configure sensing circuit 60 as a slower performing device.

Figure 6:
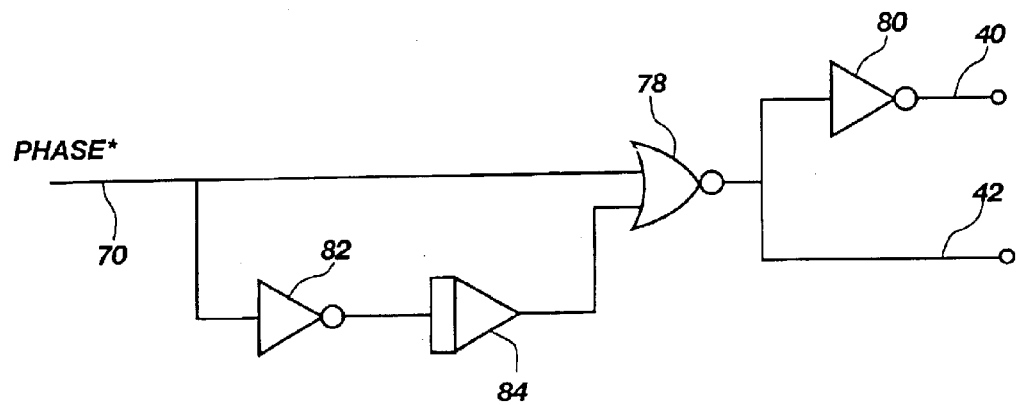
FIG. 6 is circuit diagram for controlling the activation of the pull-down circuit, in accordance with another embodiment of the present invention.

FIG. 6 is a circuit diagram of a circuit for generating the N-sense below-ground control signal 42, in accordance with another embodiment of the present invention. In FIG. 6, the sense enablement phase* control signal 70 couples to logic gates 78, 80, 82 and delay element 84 to form the N-sense ground control signal 40 and the N-sense below-ground control signal 42. Additionally, the delay element 84 is adjusted in conjunction with the logic to prevent the simultaneous assertion of both the N-sense below-ground control signal 42 and the P-sense control signal 38. While the circuit of FIG. 6 is illustrated as one embodiment of a pulse generator, other pulse generator embodiments are also contemplated which may form the desired waveform for the N-sense activation status signal 74 as illustrated in FIG. 7.

Figure 7:
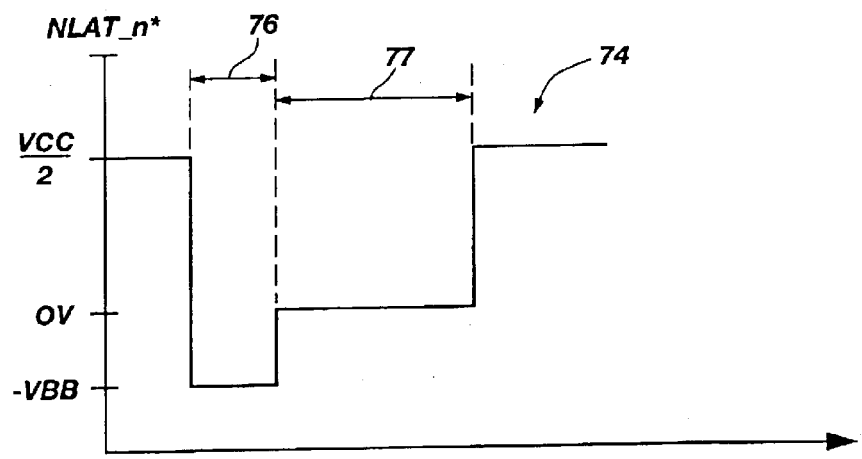
FIG. 7 is a waveform diagram illustrating the pull-down potential presented to the cross-coupled sensing circuit, in accordance with the pull-down control circuit of FIG. 6.

FIG. 7 illustrates the multistage pull-down waveform as generated by the circuit of FIG. 6 and as observed at the N-sense activation status signal 74. It should be noted that both the circuits of FIGS. 4 and 6 generate comparable waveforms, namely a time period 76 wherein the N-sense below-ground control signal 42 is activated and a time period 77 wherein both the N-sense ground control signal 40 and the P-sense control signal 38 may be activated, either simultaneously or in a staggered manner, which may be preferable for a particular semiconductor fabrication.

Figure 8:
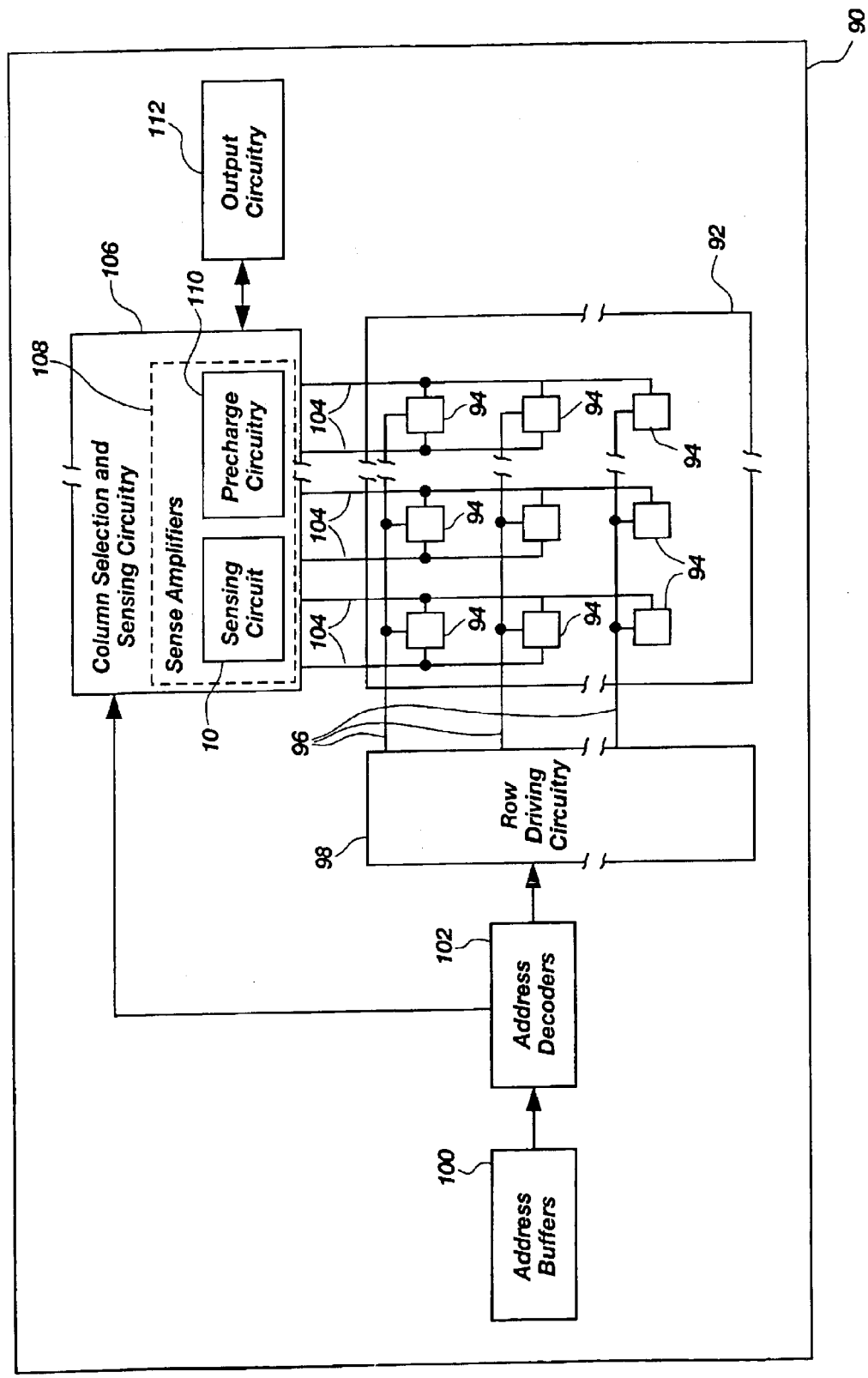
FIG. 8 is a block diagram of a semiconductor memory including the sensing circuit, in accordance with the present invention.

As shown in FIG. 8, a semiconductor memory 90 includes an array 92 of memory cells 94 activated by wordlines 96 fired by row driving circuitry 98 coupled to address buffers 100 and address decoders 102. A plurality of data lines 104 communicate logic bits between the memory cells 94 and column selection and sensing circuitry 106 that includes sense amplifiers 108. Sense amplifiers 108 each include the sensing circuit 10 of the present invention and may further include precharge circuitry 110 and output circuitry 112.

In memory operations of the semiconductor memory 90, the process of reading a logic bit from one of the memory cells 94 begins with the row driving circuitry 98 firing one of the active word lines 96. While the word line 96 is propagating, the memory cells 94 connected to the active word line 96 fired by the row driving circuitry 98 activate and begin generating differential voltages on the data lines 104 representative of their stored logic bits. Once these differential voltages are of sufficient magnitude to be sensed by the sense amplifiers 108, the column selection and sensing circuitry 106 fires the sense amplifiers 108, thus allowing the sense amplifiers 108 to sense the differential voltages on the data lines 104. A selected one of the logic bits represented by one of the sensed differential voltages is subsequently provided to the output circuitry 112 for use by external circuitry (not shown). Precharging of nodes within the sensing circuit may also be performed by precharge circuitry 110 prior to firing the sensing circuit 10.

Figure 9:
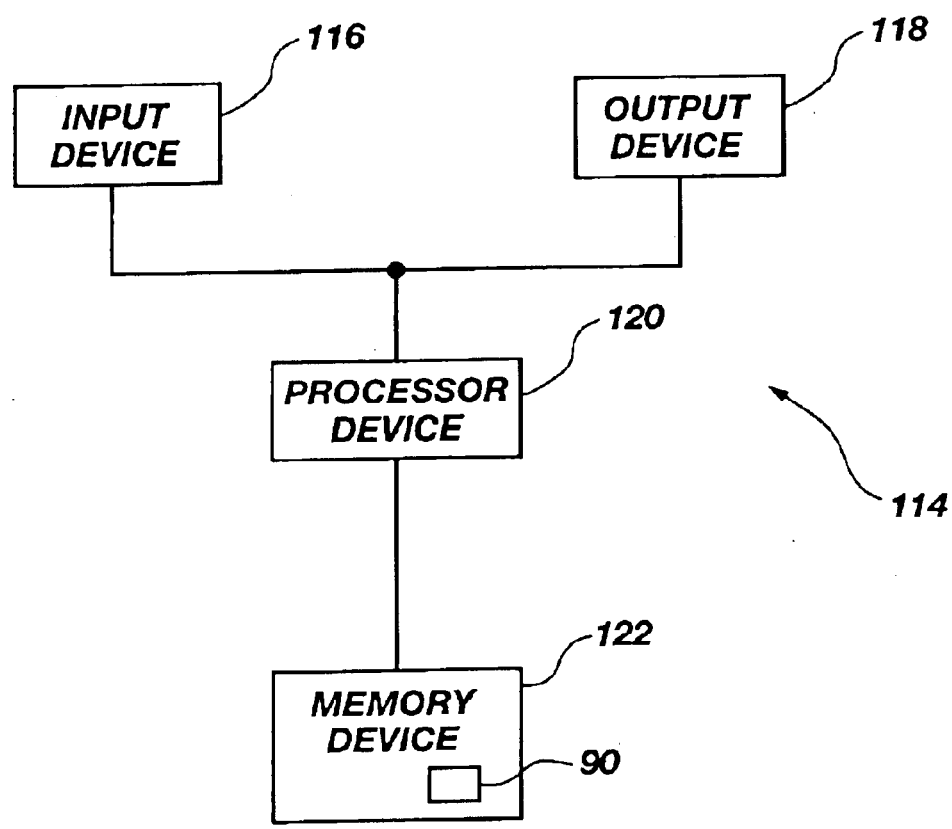
FIG. 9 is a block diagram of an electronic device including the sensing circuit, in accordance with the present invention.
Figure 10:
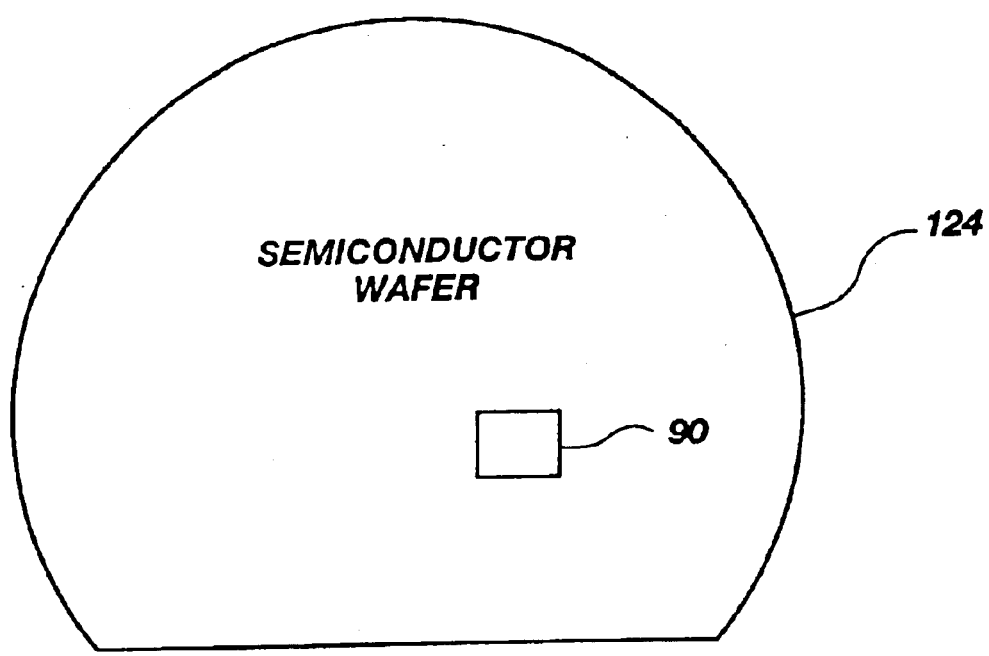
FIG. 10 is diagram of a semiconductor wafer on which is fabricated the memory device including the sensing circuit of the present invention.

As shown in FIG. 9, an electronic system 114 includes an input device 116, an output device 118, a processor device 120, and a memory device 122 incorporating the semiconductor memory 90 of FIG. 8. As shown in FIG. 10, a semiconductor wafer 124 incorporates the semiconductor memory 90 of FIG. 8.

Although the present invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A differential sensing circuit, comprising:
    a cross-coupled sensing circuit operably configured to couple with a data line pair and sense a stored logic level resident within a memory element;
    a pull-up circuit electrically coupled to the cross-coupled sensing circuit and configured for electrically coupling the cross-coupled sensing circuit to a pull-up potential during sensing of the stored logic level; and
    a pull-down circuit electrically coupled to the cross-coupled sensing circuit and configured for sequentially coupling the cross-coupled sensing circuit to a below-ground potential and a ground potential.

2. The circuit, as recited in claim 1, wherein the pull-up circuit includes pull-up control logic configured to electrically couple the cross-coupled sensing circuit to the pull-up potential following the coupling of the cross-coupled sensing circuit to the below-ground potential.

3. The circuit, as recited in claim 2, wherein the pull-down control circuit and the pull-up control logic further comprise control logic to respectively electrically couple the cross-coupled sensing circuit to the ground potential and the pull-up potential subsequent to the pull-down control circuit coupling the cross-coupled sensing circuit to the below-ground potential.

4. The circuit, as recited in claim 1, wherein the pull-down control circuit further comprises logic to electrically inhibit simultaneous electrical coupling of the cross-coupled sensing circuit to the pull-up potential and the below-ground potential.

5. The circuit, as recited in claim 1, wherein the pull-down control circuit further comprises a delay element configured to alternatively couple the cross-coupled sensing circuit with the ground potential and the below-ground potential.

6. The circuit, as recited in claim 1, wherein the pull-down circuit further comprises a low leakage transistor coupling the pull-down circuit with the cross-coupled sensing circuit.

7. A sense amplifier, comprising:
    a sensing circuit configured for coupling to a data line pair of a memory element, including:
        a cross-coupled sensing circuit including NMOS and PMOS transistors configured for electrically coupling between the data line pair;
        a pull-up circuit electrically coupled to the PMOS transistors of the cross-coupled sensing circuit and configured for electrically coupling to a pull-up potential; and
        a pull-down circuit electrically coupled to the NMOS transistors of the cross-coupled sensing circuit and configured for sequentially coupling the cross-coupled sensing circuit to a below-ground potential and a ground potential; and
    precharge circuitry electrically coupled to the cross-coupled sensing circuit and configured to precharge the cross-coupled sensing circuit to a precharge potential prior to sensing a stored logic level.

8. The sense amplifier, as recited in claim 7, wherein the pull-down circuit includes pull-down control logic configured to initiate coupling of the cross-coupled sensing circuit to the below-ground potential to accelerate separation of the potentials on the data line pair when coupled to the stored logic level from the memory element.

9. The sense amplifier, as recited in claim 8, wherein the pull-up circuit includes pull-up control logic configured to electrically couple the cross-coupled sensing circuit to the pull-up potential following the coupling of the cross-coupled sensing circuit to the below-ground potential.

10. The sense amplifier, as recited in claim 9, wherein the pull-down control logic and the pull-up control logic further comprise control logic to respectively electrically couple the cross-coupled sensing circuit to the ground potential and the pull-up potential subsequent to the pull-down control logic coupling the cross-coupled sensing circuit to the below-ground potential.

11. The sense amplifier, as recited in claim 8, wherein the pull-down control logic further comprises logic to electrically inhibit simultaneous electrical coupling of the cross-coupled sensing circuit to the pull-up potential and the below-ground potential.

12. The sense amplifier, as recited in claim 8, wherein the pull-down control logic further comprises a delay element configured to sequentially couple the cross-coupled sensing circuit with the below-ground potential and the ground potential.

13. A memory device, comprising:
at least one memory element electrically coupled to a data line pair;
a sense amplifier electrically coupled to the data line pair, the sense amplifier including:
a cross-coupled sensing circuit operably configured to couple with the data line pair and sense a stored logic level resident within the memory element;
a pull-up circuit electrically coupled to the cross-coupled sensing circuit and configured for coupling the cross-coupled sensing circuit with a pull-up potential during sensing of the stored logic level; and
a pull-down circuit electrically coupled to the cross-coupled sensing circuit and configured for sequentially coupling the cross-coupled sensing circuit to a below-ground potential and a ground potential.

14. The memory device, as recited in claim 13, further comprising precharge circuitry electrically coupled to the cross-coupled sensing circuit and configured to precharge the cross-coupled sensing circuit to a precharge potential prior to sensing the stored logic level.

15. The memory device, as recited in claim 13, wherein the pull-down circuit includes pull-down control logic configured to initiate coupling of the cross-coupled sensing circuit to the below-ground potential and then to the ground potential.

16. The memory device, as recited in claim 15, wherein the pull-up circuit includes pull-up control logic configured to electrically couple the cross-coupled sensing circuit to the pull-up potential following the coupling of the cross-coupled sensing circuit to the below-ground potential.

17. The memory device, as recited in claim 16, wherein the pull-down control logic and the pull-up control logic further comprise control logic to respectively electrically couple the cross-coupled sensing circuit to the ground potential and the pull-up potential subsequent to the pull-down control logic coupling the cross-coupled sensing circuit to the below-ground potential.

18. The memory device, as recited in claim 15, wherein the pull-down control logic further comprises logic to electrically inhibit simultaneous electrical coupling of the cross-coupled sensing circuit to the pull-up potential and the below-ground potential.

19. The memory device, as recited in claim 15, wherein the pull-down control logic further comprises a delay element configured to alternatively couple the cross-coupled sensing circuit with the ground potential and the below-ground potential.

20. A semiconductor memory, comprising:
an address buffer;
address decoders coupled to the address buffer;
row driving circuitry coupled to the address decoders;
a memory array coupled to the row driving circuitry;
column selection circuitry coupled to the address decoders and the memory array; and
sense amplifiers coupled to the memory array via data line pairs, each sense amplifier comprising:
a cross-coupled sensing circuit operably configured to couple with one of the data line pairs and sense a stored logic level resident within the memory array;
a pull-up circuit electrically coupled to the cross-coupled sensing circuit and configured for coupling the cross-coupled sensing circuit with a pull-up potential during sensing of the stored logic level; and
a pull-down circuit electrically coupled to the cross-coupled sensing circuit and configured for sequentially coupling the cross-coupled sensing circuit to a below-ground potential and a ground potential.

21. The semiconductor memory, as recited in claim 20, further comprising precharge circuitry electrically coupled to the cross-coupled sensing circuit and configured to precharge the cross-coupled sensing circuit to a precharge potential prior to sensing the stored logic level.

22. The semiconductor memory, as recited in claim 20, wherein the pull-down circuit includes pull-down control logic configured to initiate coupling of the cross-coupled sensing circuit to the below-ground potential and then to the ground potential.

23. The semiconductor memory, as recited in claim 22, wherein the pull-up circuit includes pull-up control logic configured to electrically couple the cross-coupled sensing circuit to the pull-up potential following the coupling of the cross-coupled sensing circuit to the below-ground potential.

24. An electronic system comprising an input device, an output device, a memory device, and a processor device operably couple to the input device, and output device, and memory device, wherein the memory device comprises:
at least one memory element electrically coupled to a data line pair;
a sense amplifier electrically coupled to the data line pair, the sense amplifier including:
a cross-coupled sensing circuit operably configured to couple with the data line pair and sense a stored logic level resident within the memory element;
a pull-up circuit electrically coupled to the cross-coupled sensing circuit and configured for coupling the cross-coupled sensing circuit with a pull-up potential during sensing of the stored logic level; and
a pull-down circuit electrically coupled to the cross-coupled sensing circuit and configured for sequentially coupling the cross-coupled sensing circuit to a below-ground potential and a ground potential.

25. The electronic system, as recited in claim 24, further comprising precharge circuitry electrically coupled to the cross-coupled sensing circuit and configured to precharge the cross-coupled sensing circuit to a precharge potential prior to sensing the stored logic level.

26. The electronic system, as recited in claim 24, wherein the pull-down circuit includes pull-down control logic configured to initiate coupling of the cross-coupled sensing circuit to the below-ground potential and then to the ground potential.

27. The electronic system, as recited in claim 26, wherein the pull-down control logic further comprises logic to electrically inhibit simultaneous electrical coupling of the cross-coupled sensing circuit to the pull-up potential and the below-ground potential.

28. The electronic system, as recited in claim 26, wherein the pull-up circuit includes pull-up control logic configured to electrically couple the cross-coupled sensing circuit to the pull-up potential following the coupling of the cross-coupled sensing circuit to the below-ground potential.

29. The electronic system, as recited in claim 28, wherein the pull-down control logic and the pull-up control logic further comprise control logic to respectively electrically couple the cross-coupled sensing circuit to the ground potential and the pull-up potential subsequent to the pull-down control logic coupling the cross-coupled sensing circuit to the below-ground potential.

30. A semiconductor wafer on which is fabricated at least one memory device, the at least one memory device comprising:
- at least one memory element electrically coupled to a data line pair;
- a sense amplifier electrically coupled to the data line pair, the sense amplifier including:
  - a cross-coupled sensing circuit operably configured to couple with the data line pair and sense a stored logic level resident within the memory element;
  - a pull-up circuit electrically coupled to the cross-coupled sensing circuit and configured for coupling the cross-coupled sensing circuit with a pull-up potential during sensing of the stored logic level; and
  - a pull-down circuit electrically coupled to the cross-coupled sensing circuit and configured for sequentially coupling the cross-coupled sensing circuit to a below-ground potential and a ground potential.

31. The semiconductor wafer, as recited in claim 30, further comprising precharge circuitry electrically coupled to the cross-coupled sensing circuit and configured to precharge the cross-coupled sensing circuit to a precharge potential prior to sensing the stored logic level.

32. The semiconductor wafer, as recited in claim 30, wherein the pull-down circuit includes pull-down control logic configured to initiate coupling of the cross-coupled sensing circuit to the below-ground potential and then to the ground potential.

33. The semiconductor wafer, as recited in claim 32, wherein the pull-down control logic further comprises a delay element configured to sequentially couple the cross-coupled sensing circuit with the below-ground potential and the ground potential.

34. The semiconductor wafer, as recited in claim 32, wherein the pull-up circuit includes pull-up control logic configured to electrically couple the cross-coupled sensing circuit to the pull-up potential following the coupling of the cross-coupled sensing circuit to the below-ground potential.

35. The semiconductor wafer, as recited in claim 34, wherein the pull-down control logic and the pull-up control logic further comprise control logic to respectively electrically couple the cross-coupled sensing circuit to the ground potential and the pull-up potential subsequent to the pull-down control logic coupling the cross-coupled sensing circuit to the below-ground potential.

36. The semiconductor wafer, as recited in claim 32, wherein the pull-down control logic further comprises logic to electrically inhibit simultaneous electrical coupling of the cross-coupled sensing circuit to the pull-up potential and the below-ground potential.

37. A method for sensing the state of a memory element, comprising:
- coupling the memory element to a data line pair operably coupled to a cross-coupled sensing circuit configured to sense the state of the memory element;
- pulling down the cross-coupled sensing circuit to a below-ground potential for a first time interval; and
- for at least a portion of a second time interval, simultaneously pulling up the cross-coupled sensing circuit to a pull-up potential and pulling down the cross-coupled sensing circuit to a ground potential.

38. The method, as recited in claim 37, further comprising precharging the data line pair to a predetermined potential.

* * * * *

UNITED STATES PATENT AND TRADEMARK OFFICE
CERTIFICATE OF CORRECTION

PATENT NO. : 6,873,559 B2  Page 1 of 1
APPLICATION NO. : 10/345008
DATED : March 29, 2005
INVENTOR(S) : Ueda It is certified that error appears in the above-identified patent and that said Letters Patent is hereby corrected as shown below:

In column 7, line 1, in Claim 8, after "of" delete "the".

In column 7, line 32, in Claim 13, after "the" insert -- at least one --.

In column 8, line 44, in Claim 24, delete "couple" and insert -- coupled --, therefor.

In column 8, line 44, in Claim 24, after "input device," delete "and" and insert -- the --, therefor.

In column 8, line 44, in Claim 24, after "output device, and" insert -- the --.

In column 8, line 52, in Claim 24, after "the" insert -- at least one --.

In column 9, line 30, in Claim 30, after "the" insert -- at least one --.

Signed and Sealed this

Twenty-ninth Day of April, 2008

JON W. DUDAS
*Director of the United States Patent and Trademark Office*